(12) United States Patent
Pachamuthu et al.

(10) Patent No.: US 9,230,974 B1
(45) Date of Patent: Jan. 5, 2016

(54) METHODS OF SELECTIVE REMOVAL OF BLOCKING DIELECTRIC IN NAND MEMORY STRINGS

(71) Applicant: SanDisk Technologies, Inc., Plano, TX (US)

(72) Inventors: Jayavel Pachamuthu, San Jose, CA (US); Johann Alsmeier, San Jose, CA (US); George Matamis, Danville, CA (US); Henry Chien, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/468,743

(22) Filed: Aug. 26, 2014

(51) Int. Cl.
*H01L 29/76* (2006.01)
*H01L 27/115* (2006.01)

(52) U.S. Cl.
CPC .... *H01L 27/11556* (2013.01); *H01L 27/11582* (2013.01)

(58) Field of Classification Search
CPC . H01L 29/76; H01L 27/115; H01L 27/11551; H01L 27/11578
USPC ............................................. 257/314; 438/26
See application file for complete search history.

(56) References Cited

U.S. PATENT DOCUMENTS

| | | | |
|---|---|---|---|
| 5,084,417 A | 1/1992 | Joshi et al. | |
| 5,807,788 A | 9/1998 | Brodsky et al. | |
| 5,915,167 A | 6/1999 | Leedy | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,378,353 B2 | 5/2008 | Lee et al. | |
| 7,514,321 B2 | 4/2009 | Mokhlesi et al. | |
| 7,575,973 B2 | 8/2009 | Mokhlesi et al. | |
| 7,608,195 B2 | 10/2009 | Wilson | |
| 7,648,872 B2 | 1/2010 | Benson | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,093,725 B2 | 1/2012 | Wilson | |
| 8,187,936 B2 | 5/2012 | Alsmeier et al. | |

(Continued)

FOREIGN PATENT DOCUMENTS

WO     WO02/15277 A2    2/2002

OTHER PUBLICATIONS

Endoh, et al., "Novel Ultra High Density Memory with a Stacked-Surrounding Gate Transistor (S-SGT) Structured Cell," IEDM Proc. (2001) 33-36.

(Continued)

*Primary Examiner* — Phuc Dang
(74) *Attorney, Agent, or Firm* — The Marbury Law Group PLLC

(57) ABSTRACT

Methods of making a monolithic three dimensional NAND string may enable selective removal of a blocking dielectric material, such as aluminum oxide, without otherwise damaging the device. Blocking dielectric may be selectively removed from the back side (e.g., slit trench) and/or front side (e.g., memory opening) of the NAND string. Also disclosed are NAND strings made in accordance with the embodiment methods.

39 Claims, 10 Drawing Sheets

(56) References Cited

U.S. PATENT DOCUMENTS

| | | | |
|---|---|---|---|
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,415,742 | B2 | 4/2013 | Kim et al. |
| 8,658,499 | B2 | 2/2014 | Makala et al. |
| 8,907,398 | B2 * | 12/2014 | Yun et al. .................. 257/314 |
| 2006/0102586 | A1 | 5/2006 | Lee et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0213527 | A1 * | 8/2010 | Shim et al. .................. 257/314 |
| 2010/0240205 | A1 * | 9/2010 | Son et al. .................. 438/588 |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0298037 | A1 * | 12/2011 | Choe et al. .................. 257/324 |
| 2012/0001247 | A1 | 1/2012 | Alsmeier |
| 2012/0001249 | A1 | 1/2012 | Alsmeier |
| 2012/0256247 | A1 | 10/2012 | Alsmeier |
| 2013/0009236 | A1 * | 1/2013 | Lee et al. .................. 257/329 |
| 2013/0122712 | A1 | 5/2013 | Kim et al. |
| 2013/0224960 | A1 | 8/2013 | Payyapilly et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0225181 | A1 | 8/2014 | Makala et al. |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Y.S. Kim et al., "Direct Copper Electroless Deposition on a Tungsten Barrier Layer for Ultralarge Scale Integration," Journal of the Electrochemical Society, vol. 152 (2) 2005.
Y. Au et al., "Filling Narrow Trenches by Iodine-Catayzed CVD of Copper and Manganese on Manganese Nitride Barrier/Adhesion Layers," Journal of the Electrochemical Society, vol. 158 (5) 2011.
K. R. Williams et al., "Etch Rates for Micromachining Processing," Journal of Microelectromechanical Systems, vol. 5, No. 4, Dec. 1996.
K. R. Williams et al., "Etch Rates for Micromachining Processing Part II," Journal of the Microelectromechanical Systems, vol. 12, No. 6, Dec. 2003.
M. Claes et al., "Selective Wet Etching of Hf-based Layers," Abstracts, 204th Meeting of the Electrochemical Society, 2003.
Kanakamedala, S.K. et al., "Methods of Making Three Dimensional Nand Devices," U.S. Appl. No. 14/319,283, filed Jun. 30, 2014.
U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/456,515, filed Aug. 11, 2014, SanDisk Technologies Inc.
U.S. Appl. No. 14/456,496, filed Aug. 11, 2014, SanDisk Technologies Inc.

* cited by examiner

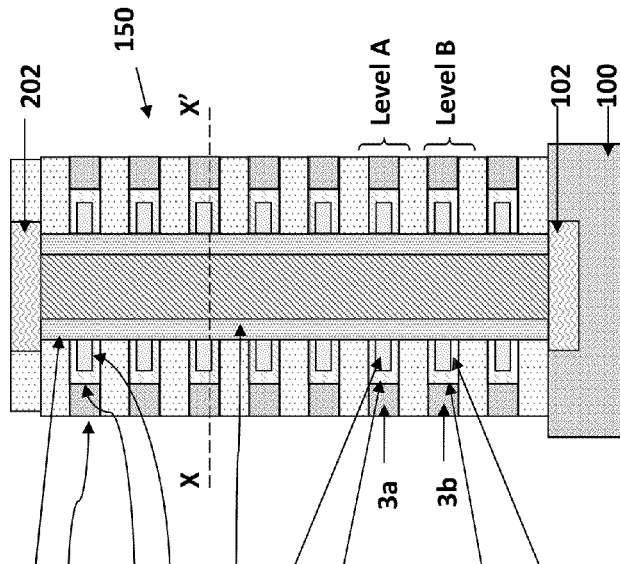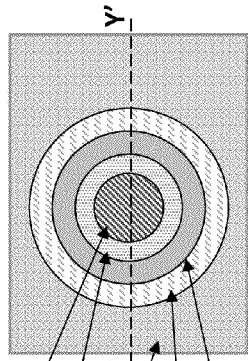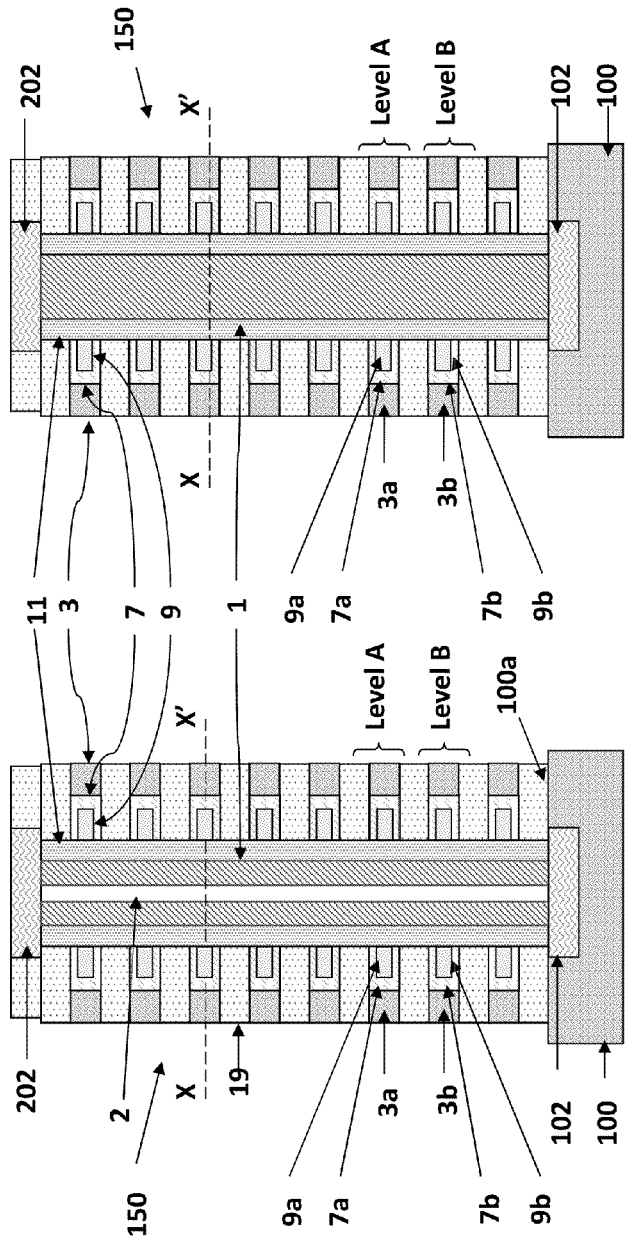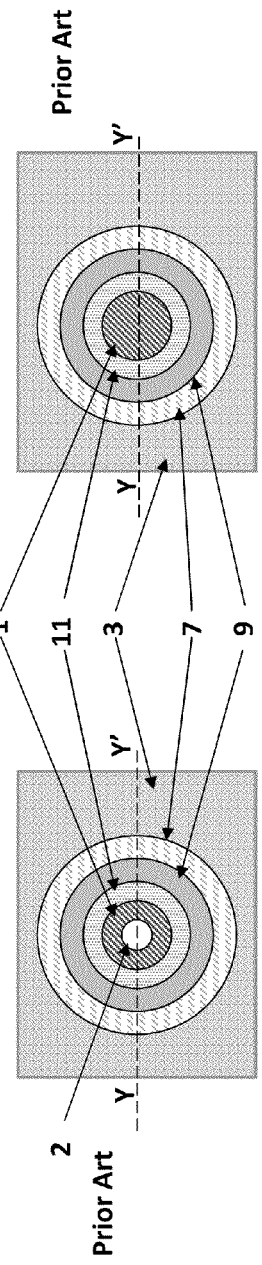

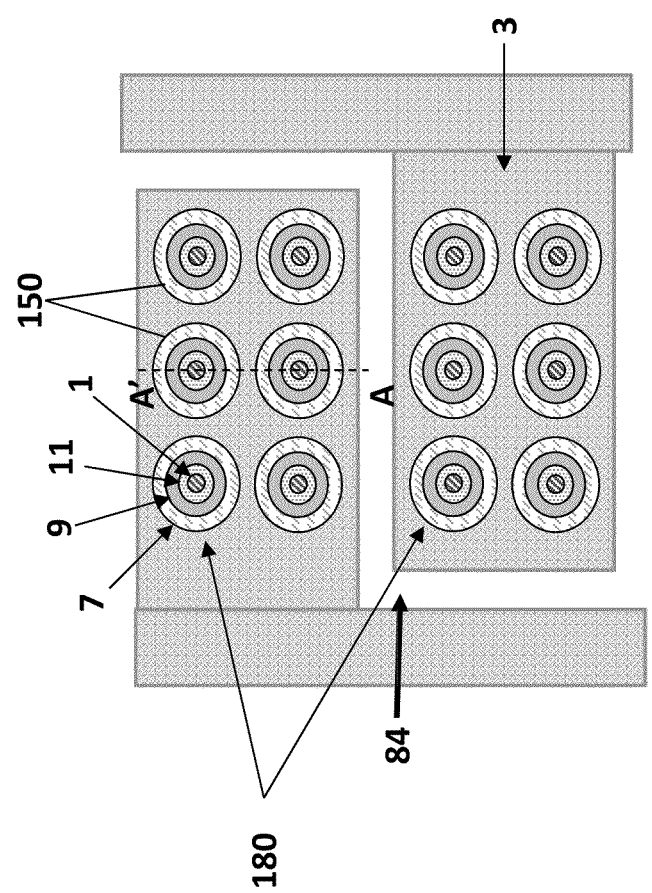

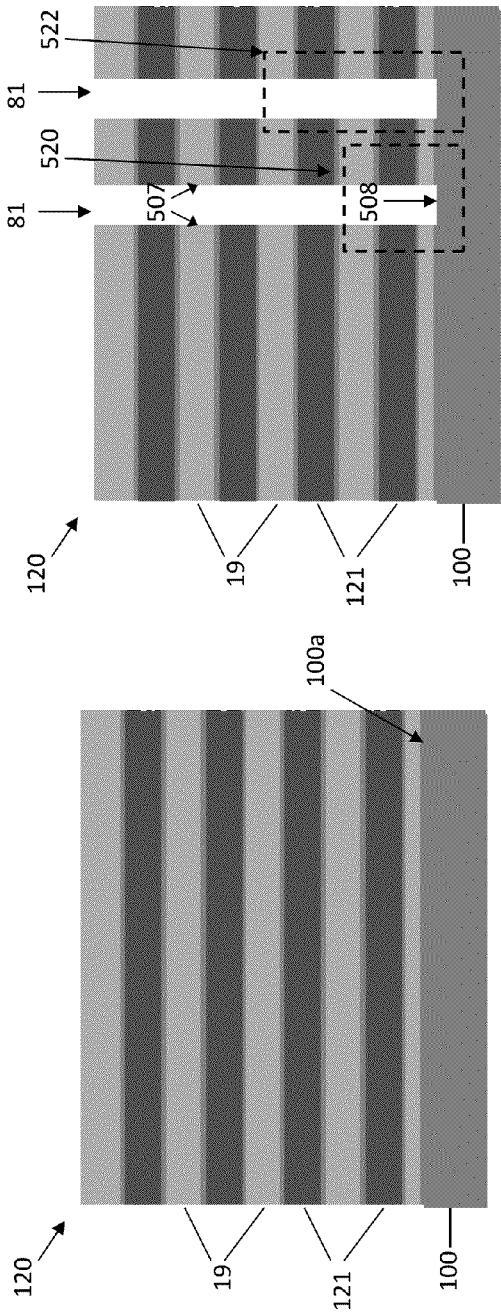
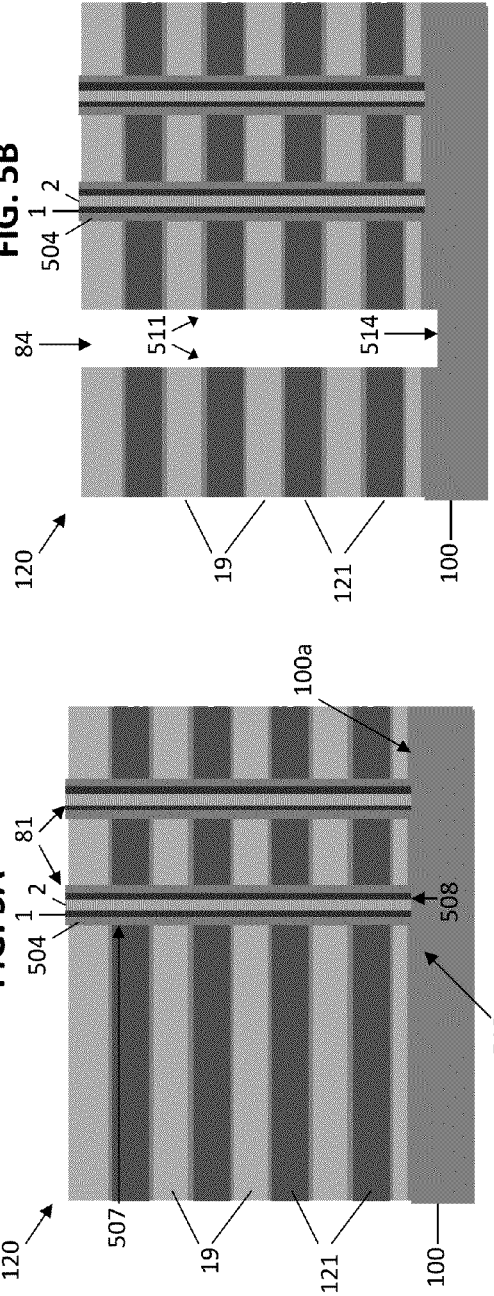
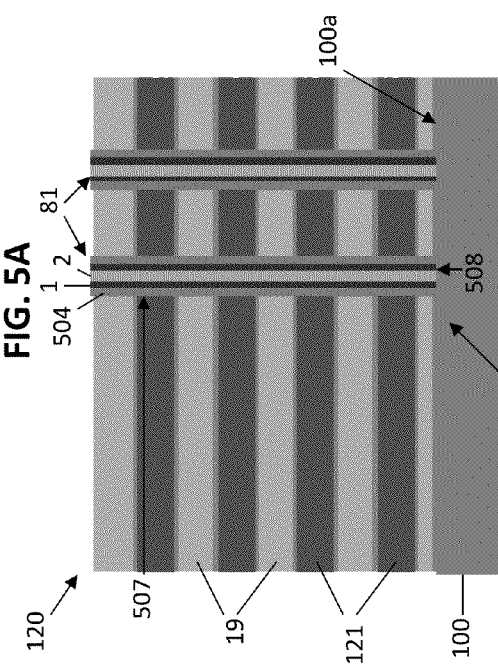

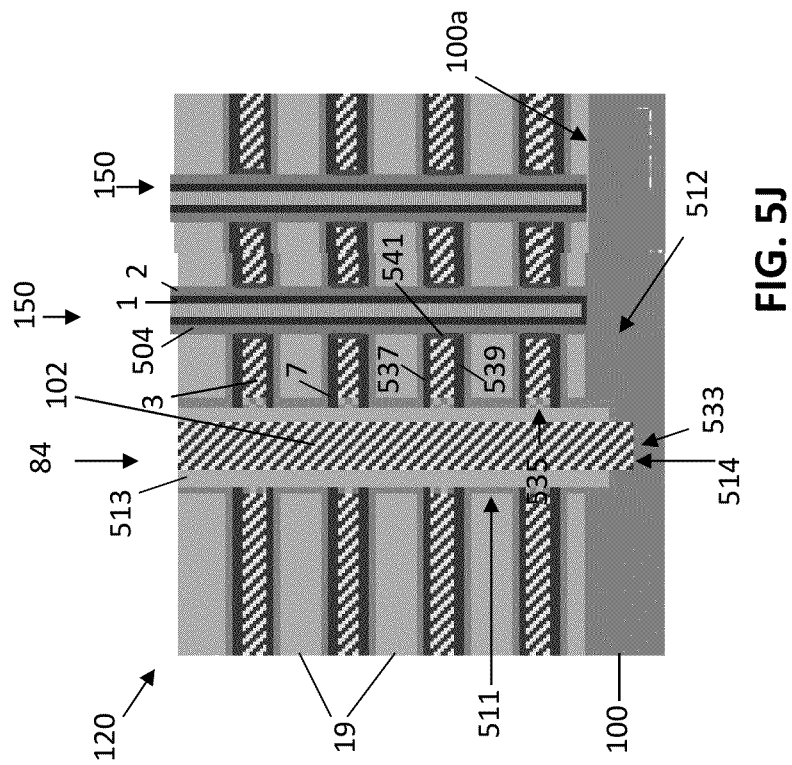
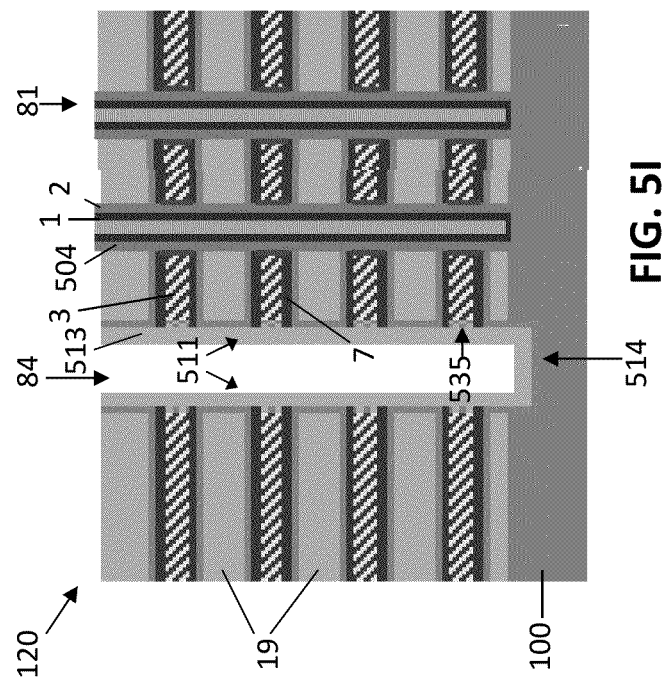

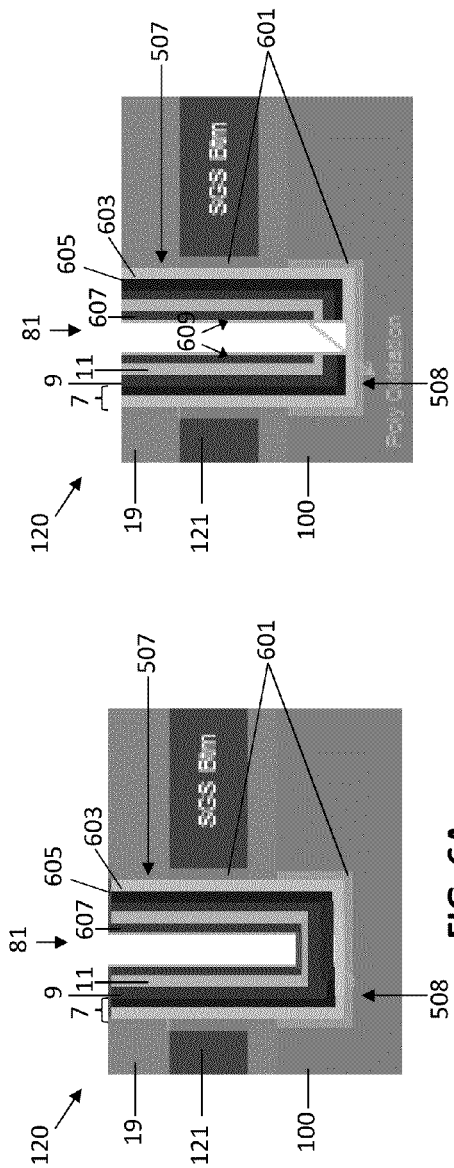
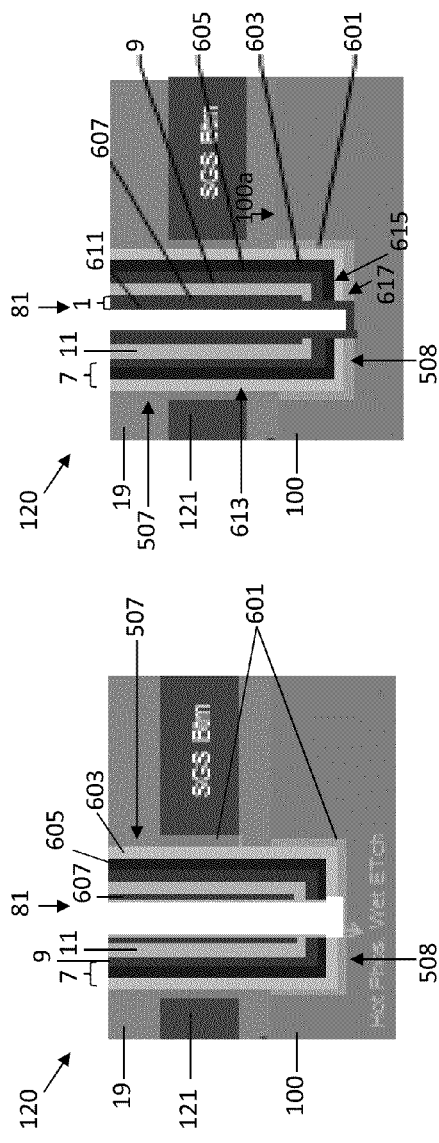
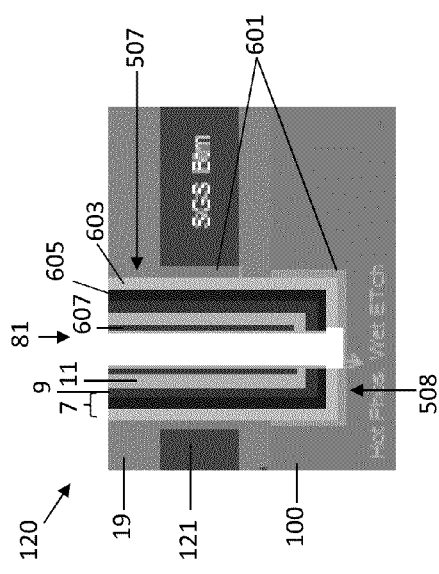
FIG. 6A  FIG. 6B  FIG. 6C  FIG. 6D

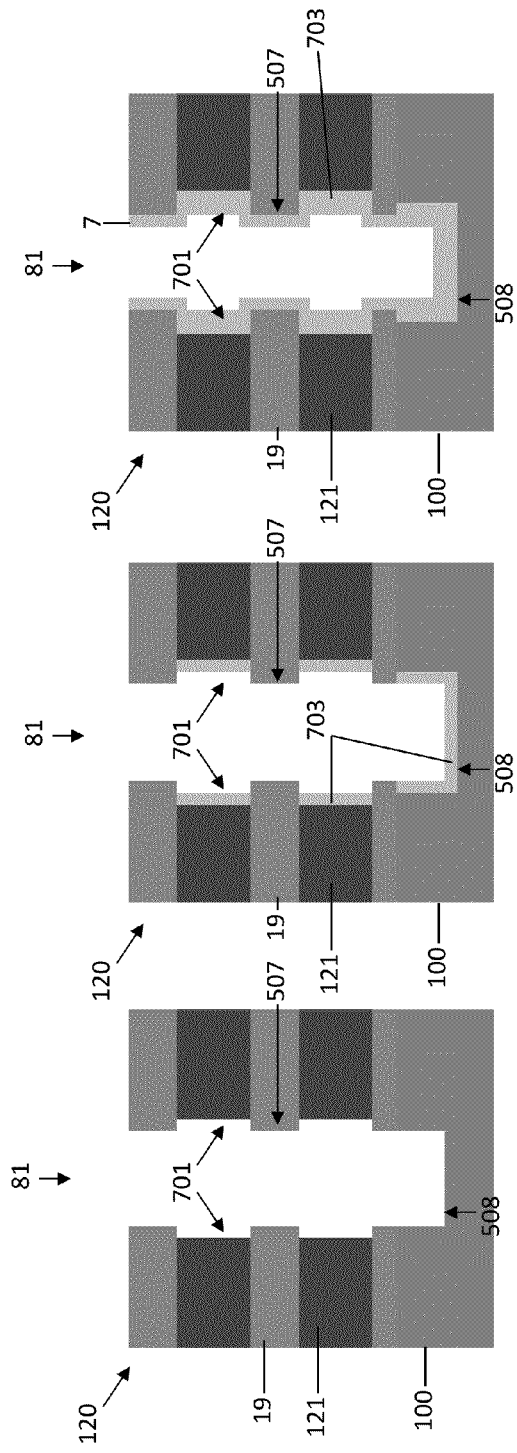

METHODS OF SELECTIVE REMOVAL OF BLOCKING DIELECTRIC IN NAND MEMORY STRINGS

FIELD

The present disclosure relates generally to the field of semiconductor devices and specifically to monolithic three dimensional NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active region of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string that includes forming a stack of alternating layers of a first material and a second material different than the first material over a substrate, etching the stack to form a front side opening in the stack, forming at least one memory film over a sidewall of the front side opening, forming a semiconductor channel over the at least one memory film in the front side opening, etching the stack to form a back side opening in the stack, the backside opening including a pair of oppositely disposed sidewalls and a bottom surface, removing by etching at least a portion of the second material layers through the back side opening to form back side recesses between the first material layers, forming a blocking dielectric over the sidewalls and bottom surface of the backside opening and within the back side recesses, forming control gates including a metal material over the blocking dielectric in the back side recesses through the back side opening, where each control gate includes a first side surface facing the semiconductor channel in the front side opening and a second side surface opposite the first side surface that forms a portion of a sidewall of the back side opening, oxidizing a portion of the metal material of the control gates adjacent to the second side surfaces of the control gates, etching the back side opening using a wet chemical etch to remove the blocking dielectric from the sidewalls and the bottom surface of the backside opening.

Another embodiment relates to a method of making a monolithic three dimensional NAND string that includes forming a stack of alternating layers of a first material and a second material different than the first material over a substrate, etching the stack to form a front side opening in the stack, forming a blocking dielectric on a sidewall and a bottom surface of the front side opening, forming a charge storage layer over the blocking dielectric on the sidewall and bottom surface of the front side opening, forming a tunnel dielectric layer over the charge storage layer on the sidewall and bottom surface of the front side opening, forming a semiconductor cover layer over the tunnel dielectric layer on the sidewall and bottom surface of the front side opening, removing by a first etching process portions of the semiconductor cover layer, the tunnel dielectric layer and the charge storage layer over the bottom surface of the front side opening to expose the blocking dielectric over the bottom surface of the front side opening, forming a protective oxide layer over the semiconductor cover layer on the sidewall of the front side opening, removing by a second etching process the blocking dielectric over the bottom surface of the front side opening, where the protective oxide layer protects the semiconductor cover layer on the sidewall of the front side opening from etching damage during the second etching process, and the second etching process is different from the first etching process, removing by a third etching process the protective oxide layer to expose the semiconductor cover layer on the sidewall of the front side opening, where the third etching process is different from the second etching process, and forming a semiconductor channel over the semiconductor cover layer over the sidewall of the front side opening and contacting the bottom surface of the front side opening.

Another embodiment relates to a method of making a monolithic three dimensional NAND string that includes forming a stack of alternating layers of a first material and a second material different than the first material over a substrate, etching the stack to form a front side opening in the stack comprising a sidewall and a bottom surface, removing a first portion of the second material layers through the front side opening to form front side recesses between the first material layers on the sidewall of the front side opening, forming a blocking dielectric over the sidewall and bottom surface of the front side opening and within the front side recesses, forming an oxide cover layer over the blocking dielectric on the sidewall and bottom surface of the front side opening and within the front side recesses, removing by etching a first portion of the oxide cover layer from the sidewall and the bottom surface of the front side opening to provide discrete segments of a second portion of the oxide cover layer within the respective front side recesses, removing by etching a first portion of the blocking dielectric from the sidewall and the bottom surface of the front side opening to provide discrete segments of a second portion of the blocking dielectric within the respective front side recesses, where the discrete segments of the oxide cover layer prevent the blocking dielectric within the front side recesses from being etched, removing by etching the discrete segments of the second portion of the oxide cover layer from the front side recesses, forming a charge storage layer on the sidewall and bottom surface of the front side opening and over the discrete segments of the second portion of the blocking dielectric within the front side recesses, forming a tunnel dielectric layer over the charge storage layer on the sidewall and bottom surface of the front side opening, forming a semiconductor cover layer over the tunnel dielectric layer on the sidewall and bottom surface of the front side opening, removing by etching portions of the semiconductor cover layer, the tunnel dielectric layer and the charge storage layer over the bottom surface of the front side opening, and forming a semiconductor channel over the semiconductor cover layer over the sidewall of the front side opening and contacting the bottom surface of the front side opening.

Another embodiment relates to a monolithic three dimensional NAND string that includes a semiconductor channel where at least one end portion of the semiconductor channel extends substantially perpendicular to a major surface of a substrate, a plurality of control gate electrodes extending substantially parallel to the major surface of the substrate, where each control gate electrode includes a top surface, a bottom surface opposite the top surface and a first side surface facing the at least one end portion of the semiconductor channel, and the plurality of control gate electrodes include at least a first control gate electrode located in a first device level and a second control gate electrode located in a second device level located over the major surface of the substrate and below the first device level, at least one charge storage region extending substantially perpendicular to the major surface of the substrate and located adjacent to at least the first side surfaces of each of the control gate electrodes, and a tunnel dielectric located between the charge storage region and the semiconductor channel.

The monolithic three dimensional NAND string also includes a blocking dielectric located adjacent to at least the first side surfaces of each of the control gate electrodes and located between the charge storage region and each of the control gate electrodes. The blocking dielectric includes aluminum oxide, and at least one of: (i) the blocking dielectric includes discrete clam shape portions that surround the control gate electrodes on the top, bottom and first side surfaces of the control gate electrodes and the control gate electrodes include a metal oxide portion adjacent to a second side surface of the control gate electrode opposite the first side surface, (ii) the blocking dielectric includes a first portion that extends over the device levels in a direction that is substantially perpendicular to the major surface of the substrate, and a second portion that extends below the memory levels in a direction that is substantially parallel to the major surface of the substrate, the second portion including an opening extending through the second portion and the semiconductor channel extends through the opening, and (iii) the blocking dielectric includes a plurality of discrete segments located in respective recesses between control gate electrodes in each of the device levels.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a memory device comprising NAND strings.

FIGS. 5A-5J illustrate schematic side cross sectional view of steps in a method of making a NAND string having a blocking dielectric formed through a back side opening according to one embodiment.

FIGS. 6A-6D illustrate schematic side cross sectional view of steps in a method of making a NAND string having a blocking dielectric formed through a front side opening according to another embodiment.

FIGS. 7A-7J illustrate schematic side cross sectional view of steps in a method of making a NAND string having a blocking dielectric formed through a front side opening according to another embodiment.

DETAILED DESCRIPTION

Various embodiments relate to monolithic three-dimensional NAND memory strings and methods of fabricating monolithic three-dimensional NAND memory strings. In one embodiment, blocking dielectric may be formed through a back side opening (e.g., slit trench) of the NAND string, and portions of the blocking dielectric may be selectively removed from the back side opening. In other embodiments, blocking dielectric may be formed through the front side opening (i.e., memory hole) of the NAND string and portions of the blocking dielectric may be selectively removed from the front side opening.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
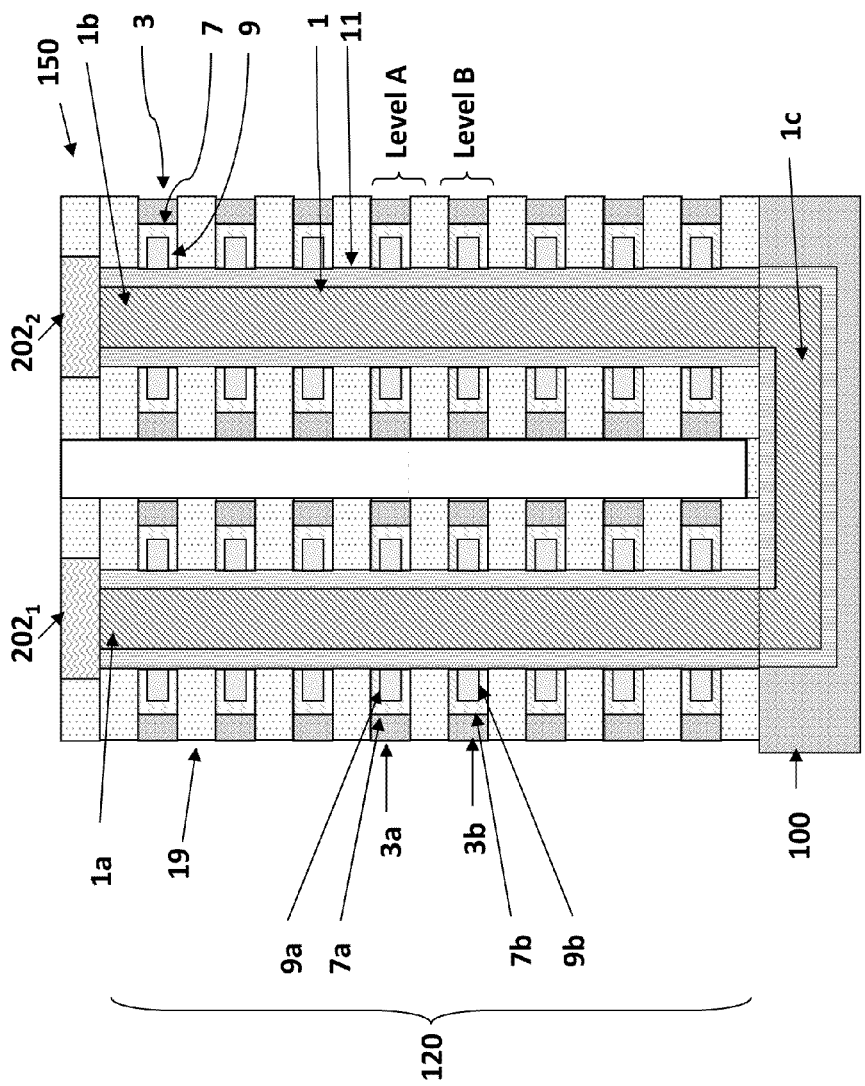
FIG. 3A is a side cross sectional view of a conventional NAND string of an embodiment with a U-shaped channel.
Figure 3B:
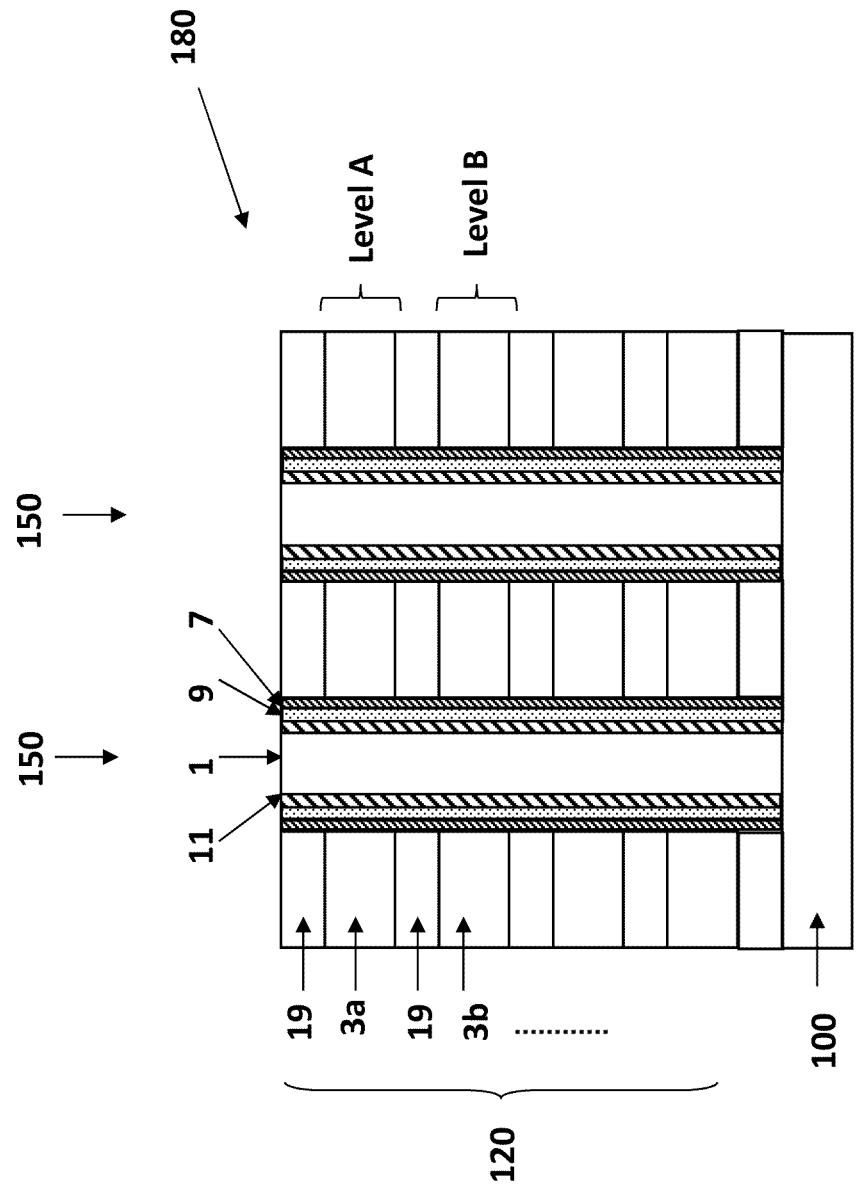
FIG. 3B is a side cross sectional view of another conventional NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 2A and 3B. The channels 1 may be electrically connected to first and second (e.g., source and drain) electrodes 102, 202 which are schematically shown in FIGS. 1A and 2A. The first (e.g., source) electrode 102 may connect to the bottom of the channel 1 and the second (e.g., drain electrode 202) may connect to the top of the channel 1. The NAND string 150 may further include drain-side and source-side select or access transistors (not shown in FIGS. 1A, 2A and 3B for clarity) which may be located above and below the memory levels of the NAND string 150, respectively.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string 150 in this embodiment may further include drain-side and source-side select or access transistors (not shown in FIG. 3A for clarity), both of which may be located above the memory levels of the NAND string 150 and electrically connected to the respective wing portions 1*a* and 1*b* of the semiconductor channel 1.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

A memory array 180 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100*a* of the substrate 100. The plurality of control gate electrodes 3 comprise at least a first control gate electrode 3*a* located in a first device level (e.g., device level A) and a second control gate electrode 3*b* located in a second device level (e.g., device level B) located over the major surface 100*a* of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i e, minor surface) of each control gate 3, as shown in FIG. 3B. The blocking dielectric 7 may comprise one or more layers having a plurality of blocking dielectric segments located in contact with a respective one of the plurality of control gate electrodes 3, for example a first dielectric segment 7*a* located in device level A and a second dielectric segment 7*b* located in device level B are in contact with control electrodes 3*a* and 3*b*, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprises a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions or segments 9 located between the blocking dielectric and the channel 1, as shown in FIGS. 1A, 2A and 3A. The plurality of discrete charge storage regions 9 comprise at least a first discrete charge storage region 9*a* located in the device level A and a second discrete charge storage region 9*b* located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a memory device comprising one or more arrays 180 of NAND strings 150 having channels 1 located in respective memory holes 81 (e.g., front side openings). In this device, the memory holes 81 are circular, thereby resulting in cylindrical pillar shaped NAND strings 150. From the top view, the tunnel dielectric 11, charge storage region 9 and blocking dielectric 7 form concentric rings around the channel 1. The control gate 3 in each device level is generally slab shaped. A back side opening 84, such as a trench, electrically separates adjacent control gates 3 and arrays 180 (e.g., memory blocks) of NAND strings 150 from each other. As discussed in more detail below, the back side opening 84 may be used in the manufacture of NAND strings 150 according to some embodiments.

Various embodiments relate to methods of making a monolithic three-dimensional NAND string 150. The NAND strings 150 may be similar to the NAND strings 150 shown in FIGS. 1A-4, and may include a semiconductor channel 1 extending substantially perpendicular to the major surface 100a of a substrate 100, and a plurality of control gates 3, each extending substantially perpendicular to the major surface 100a of the substrate 100 in a respective device level (e.g., Level A, Level B, etc.). A blocking dielectric 7, a charge storage region 9 and a tunnel dielectric 11 may be located between the control gates 3 and the semiconductor channel 1 in each of the device levels. In embodiments, the blocking dielectric 7 may be located between the control gate 3 and the charge storage region 9, the charge storage region 9 may be located between the blocking dielectric 7 and the tunnel dielectric 11, and the tunnel dielectric 11 may be located between the charge storage region 9 and the semiconductor channel 1.

There are at least two general approaches to forming the blocking dielectric 7 in a NAND string 150 as described above. In a first approach, the blocking dielectric 7 may be formed through the "back side" of the material layer stack 120 (e.g., through a back side opening 84 (e.g., trench) located adjacent to the NAND strings 150 as shown in FIG. 4). In this approach, the back side opening 84 may be formed through a stack of alternating layers of a first insulating material and a second sacrificial material. The layers of sacrificial material may be selectively removed by etching through the back side opening 84 to form recessed portions relative to the layers of the first insulating material, and the blocking dielectric 7 may be formed within the recessed portions. The control gates 3 may then be formed through the back side opening 84 within the recessed portions and over the blocking dielectric 7.

A second approach may include forming the blocking dielectric 7 through the "front side" of the material layer stack 120 (e.g., through the front side openings, e.g., generally cylindrically shaped memory openings or holes, in the stack 120 within which the vertically-extending semiconductor channel 1 is formed). In this approach, the blocking dielectric 7 may be formed over at least a portion of the sidewall of each of the front side openings, and the charge storage region(s) 9, the tunnel dielectric 11 and the semiconductor channel 1 may be formed over the blocking dielectric 7 within the front side openings. In some embodiments, the blocking dielectric 7 may be formed using both a "back side" and a "front side" approach, such as described in U.S. patent application Ser. No. 14/456,496 filed on Aug. 11, 2014, the entire contents of which are incorporated herein by reference.

In embodiments, the blocking dielectric 7 may comprise a stack of two or more different insulating layers comprising different insulating materials. For example, the different insulating materials may include silicon oxide, silicon nitride, silicon oxynitride and/or a high-k material (e.g., having a dielectric constant above 4.0) such as $Al_2O_3$, $HfO_2$, $HfSiO$, $TaO_2$ or other metal oxides. In embodiments, the blocking dielectric 7 may include a stack comprising at least one layer of silicon oxide and at least one layer of a metal oxide, such as aluminum oxide and/or hafnium oxide.

The present inventors realized that it may be challenging to selectively remove certain material(s) of the blocking dielectric 7, such as aluminum oxide, from areas of the stack 120 without causing unwanted damage to the device. For example, when the blocking dielectric 7 is formed using the "back side" approach, it may be desirable to remove the blocking dielectric 7 from the sidewalls and bottom surface of the back side opening 84. However, certain blocking dielectric materials, such as aluminum oxide, may be relatively resistant to etching, and removing the material using conventional etching techniques may cause damage to the conductive word line/control gates 3 along the sidewalls of the back side opening 84 and/or over-etching of the substrate 100 at the bottom of the back side opening 84. Similarly, when a "front side" approach is used to form the blocking dielectric 7, it may be challenging to remove the blocking dielectric 7 from the bottom of the front side opening/memory hole. Directional etching techniques may cause over-etching of the semiconductor layer (e.g., substrate 100) at the bottom of the front side opening/memory hole and re-sputter of metal material (e.g., aluminum) over the sidewall of the front side opening/memory hole. Wet etching techniques to remove the blocking dielectric may result in over-etching of other layers within the front side opening/memory hole.

Various embodiments may include methods of making a monolithic three dimensional NAND string that selectively remove a blocking dielectric material without otherwise damaging the device. Further embodiments may include NAND strings made in accordance with the embodiment methods.

A first embodiment method of making a NAND string 150 is illustrated in FIGS. 5A-5J. In this embodiment, the blocking dielectric 7 is formed using a "back side" approach (i.e., through a back side opening 84 as shown in FIG. 4), and portions of the blocking dielectric 7 are selectively removed from the sidewalls and/or bottom surface of the back side opening 84.

Figure 5E:
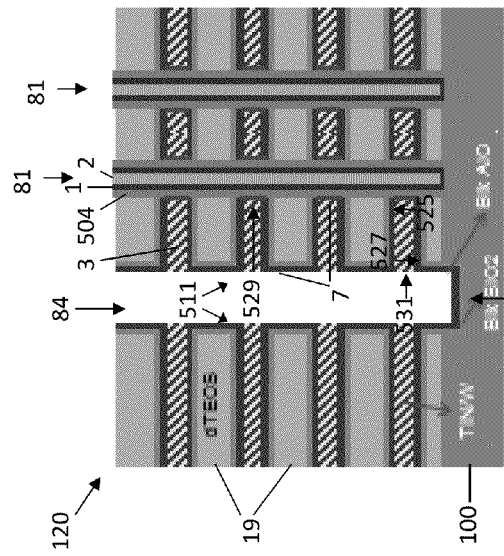

FIGS. 5A-5J are side cross-sectional views illustrating the formation of a portion of a NAND string array 180 (e.g., such as shown in FIG. 3B) and taken along line A-A' in the top schematic view of FIG. 4. As illustrated in FIG. 5A, the method includes forming a stack 120 of alternating first material layers 19 and second material layers 121 over a major surface 100a of substrate 100. The second material is different from the first material. The layers 19, 121 may be formed by a suitable deposition method, such as sputtering, CVD, PECVD, MBE, ALD, etc. The layers 19, 121 may be 6 to 100 nm thick.

In one embodiment, the first material layers 19 comprise an electrically insulating material, such as an oxide (e.g., silicon oxide, silicon oxynitride, a high-k dielectric, etc.). The second material layers 121 may comprise a sacrificial material, such as an insulating material that is different from the material of the first layers 19. For example, layers 19 may comprise silicon oxide (e.g., formed using a tetraethyl orthosilicate (TEOS) source) and layers 121 may comprise silicon nitride forming an ONON stack 120. Alternatively, layers 19 may comprise silicon oxide and layers 121 may comprise polysilicon forming an OPOP stack 120.

The formation of layers 19, 121 may be followed by etching the stack 120 to form at least one front side opening 81 in the stack 120, as shown in FIG. 5B. An array of front side openings 81 (e.g., cylindrical memory openings or holes) may be formed in locations where vertical channels of NAND strings 150 will be subsequently formed.

The front side openings 81 may be formed by photolithography and etching as follows. First, a memory hole mask (not shown in FIGS. 5A-B) may be formed over the stack 120 and patterned to form openings corresponding to the future locations of the front side openings 81. The mask may comprise any suitable material, such as one or more layer of photoresist and/or hard mask material. Then, the stack 120 may be etched (e.g., using reactive ion etching (RIE)) to form at least one opening 81 in the stack as shown in FIG. 5B. In the embodiment of FIG. 5B, the etching may be stopped at the substrate 100. Alternatively, an etch stop layer may be formed over the substrate and the etching may be stopped on the etch stop layer. Following the etching to form the front side memory openings 81, the mask may be removed.

Each of the front side memory openings 81 may include a sidewall 507 defined by the exposed surfaces of the layers 19, 121 of the stack 120 and a bottom surface 508, which in this embodiment is defined by the exposed surface of the substrate 100. Regions 520 and 522 shown in dashed lines will be described below in connection with FIGS. 6A-6D and 7A-7J, respectively.

Referring to FIG. 5C, at least one memory film 504 may be formed over the sidewalls 507 of the front side openings 81. The memory film 504 may include, for example, a charge storage material 9 and/or a tunnel dielectric layer 11 as described above in connection with FIGS. 1A-4. The charge storage material 9 may be formed over at least a portion of the sidewall 507 of each of the front side openings 81, and the tunnel dielectric layer 11 may be formed on the charge storage material 9 over at least a portion of the sidewalls 507 of the front side openings 81. In some embodiments, the memory film 504 may also include a blocking dielectric 7. The blocking dielectric 7 may be formed over at least a portion of the sidewall 507 of each of the front side openings 81, and the charge storage material 9 and tunnel dielectric 11 may be formed over the blocking dielectric 7.

In embodiments, the memory film 504 may be formed over the stack 120 including over the sidewalls 507 and bottom surfaces 508 of each of the front side openings 81, and an anisotropic etching process (e.g., an RIE process) may be performed to remove the memory film 504 from the top surface of the stack 120 and from the bottom surface 508 of the front side openings 81, while the memory film 504 may remain over the sidewalls 507 of the front side openings 81. If the memory film 504 includes multiple layers of different materials (e.g., a blocking dielectric 7, charge storage material 9 and/or tunnel dielectric layer 11) the different materials may be selectively removed from the top surface of the stack 120 and/or the bottom surfaces 508 of the front side openings 81 during the same etching step or during different etching steps.

Referring again to FIG. 5C, a semiconductor channel 1 (e.g. a polysilicon or amorphous silicon layer) may be formed over the at least one memory film 504 along the sidewalls 507 of the front side openings 81. The semiconductor channel 1 may extend substantially perpendicular to the major surface 100a of the substrate 100, and at least a portion of the memory film 504 may be located between the semiconductor channel 1 and the sidewall 507 of the front side opening 81. The semiconductor channel 1 may contact the exposed surface of the substrate 100 at the bottom surfaces 508 of the front side openings 81, as shown in FIG. 5C. Optionally, the semiconductor channel 1 may contact a semiconductor channel portion of a lower (e.g., source-side) select gate transistor (not shown in FIG. 5C for clarity). The semiconductor channel portion of the lower select gate transistor may be formed as a protrusion extending from the major surface 100a of the substrate 100 or may be located within the semiconductor substrate 100, and may define the bottom surfaces 508 of the respective memory openings 81. The semiconductor channel portion of the lower select gate transistor may electrically couple the vertically-oriented semiconductor channel 1 extending within the front side opening 81 to a horizontal channel portion 512 located on or within the substrate 100 and extending substantially parallel to the major surface 100a of the substrate 100. Examples of suitable configurations and methods for making the lower (e.g., source side) select transistors of a monolithic three dimensional array of vertical NAND strings 150 are described, for example, in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and U.S. Provisional Patent Application No. 61/977,173, filed on Apr. 9, 2014, all of which are incorporated by reference herein for all purposes.

An optional insulating fill material 2 (e.g., an oxide, such as silicon oxide) may be formed over the semiconductor channel 1 and fill the front side openings 81, as shown in FIG. 5C.

Referring to FIG. 5D, the stack 120 may be etched (e.g., through a mask patterned by photolithography, not shown in FIG. 5D) to form one or more back side openings (e.g., trenches) 84 in the stack 120. In this embodiment, the back side opening (e.g., trench) 84 extends through the entire stack 120 to the semiconductor substrate 100. The layers 19, 121 of the stack 120 may at least partially define the two opposed sidewalls 511 of the back side opening 84, and the substrate 100 may define the bottom surface 514 of the back side opening 84.

Referring to FIG. 5E, at least a portion of the second material layers 121 may be removed through the back side opening 84 to form back side recesses 509 between the first material layers 19. Layers 121 may be removed by selective etching, such as a silicon nitride selective etching (e.g., a hot phosphoric acid wet etch) which removes silicon nitride layers 121 but does not remove the silicon oxide material of layers 19.

Figure 5F:
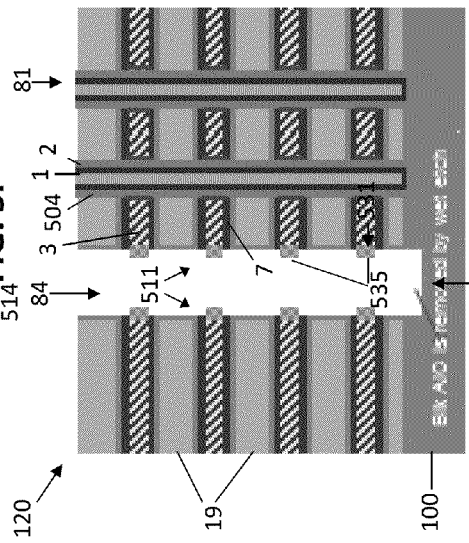

Referring to FIG. 5F, a blocking dielectric 7 may be formed in the back side recesses 509 through the back side opening 84. The blocking dielectric 7 may be formed over the exposed memory film 504 on the first side surfaces 519 of each of the back side recesses 509 (see FIG. 5E). The blocking dielectric 7 may also be formed adjacent to the first material layers 19 of the stack 120 on the top 521 and bottom 523 surfaces of each of the back side recesses 509 (see FIG. 5E). The blocking dielectric 7 may also be formed over the exposed minor surfaces of the layers 19 along the sidewalls 511 of the back side opening 84, and over the exposed surface of the substrate 100 on the bottom surface 514 of the back side opening 84.

The blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the blocking dielectric 7 may include a metal oxide material, such as aluminum oxide and/or hafnium oxide, and may comprise a stack comprising at least one layer of a metal oxide and at least one layer of an additional insulating material. For example, the blocking dielectric 7 may comprise a layer of aluminum oxide and a layer of silicon oxide.

Referring again to FIG. 5F, control gate electrodes 3 may be formed over the blocking dielectric 7 in the back side recesses 509 through the back side opening 84. Each of the control gate electrodes 3 may include a top surface 525, a bottom surface 527 opposite the top surface 525, and a first side surface 529 facing the vertically-extending semiconductor channel 1 in the memory opening 81. The control gate electrodes 3 may be formed over the blocking dielectric 7 such that the blocking dielectric 7 surrounds each of the control gate electrodes 3 on the top 525, bottom 527 and first side surfaces 529 of the control gate electrode 3. Each of the first material layers 19 of the stack 120 may be separated from the adjacent control gate electrode(s) 3 by the blocking dielectric 7. Each of the control gate electrodes 3 may be located in a respective device level (e.g., Level A, Level B, etc. as shown in FIGS. 1A, 2A, 3A and 3B) over the major surface 100a of the substrate 100.

Each of the control gate electrodes 3 may comprise one or more electrically conductive metal materials, including one or more metals or metal alloys, including metal nitrides and metal silicides. In one embodiment, the control gate electrodes 3 may be formed by depositing a metal nitride liner material (e.g., tungsten nitride (WN) or titanium nitride (TiN) liner, not shown in FIG. 5F) over the blocking dielectric 7 in the back side recesses 509, followed by depositing a metal (e.g., tungsten) over the metal nitride liner material to fill the back side recesses 509. Any of the metal and/or metal nitride liner material of the control gates 3 located in the back side opening 84 may be removed from the back side opening 84 (e.g., via one or more etching steps). A second side surface 531 of each of the control gate electrodes 3 opposite the first side surface 529 may form a portion of a sidewall 511 of the back side opening 84, as shown in FIG. 5F.

Figure 5G:
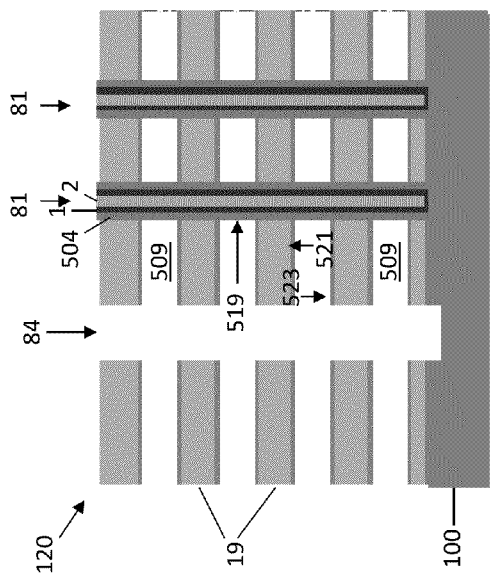

Referring to FIG. 5G, the control gate electrodes 3 may be subjected to an oxidation process to form oxidized portions 535 adjacent to the second side surfaces 531 of the control gate electrodes 3. In embodiments, the metal material (e.g., tungsten) of the control gate electrodes 3 that is exposed on the sidewalls 511 of the back side opening 84 may be oxidized by performing a plasma silane (p-SiH$_4$) oxidation (e.g., using an oxygen and silane containing plasma) through the back side opening 84 to form oxidized portions 535 (e.g., tungsten oxide regions) adjacent to the second side surfaces 531 of each of the control gate electrodes 3. As shown in FIG. 5G, discrete oxidized portions 535 of the control gates 3 may extend along the sidewalls 511 of the back side opening 84, and may be separated from one another by portions of the blocking dielectric 7 extending along the sidewalls 511. The oxidized portions 535 of the control gate electrodes 3 may protect the unoxidized metal material within the remainder of the control gate electrode 3 from damage during a subsequent etching step that is performed to selectively remove portions of the blocking dielectric 7, as described below. The oxidized portions 535 may also avoid metal (e.g., aluminum) migration from the blocking dielectric 7, which can potentially cause word line-to-word line shorts in the completed NAND string.

Figure 5H:
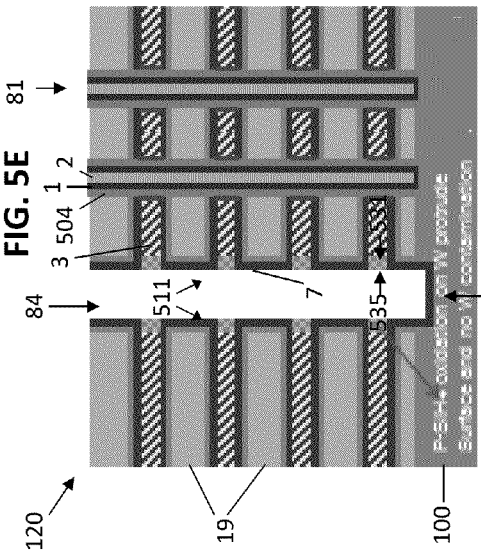

Referring to FIG. 5H, the back side opening 84 may be etched using a wet chemical etch to remove the blocking dielectric 7 from the sidewalls 511 and the bottom surface 514 of the backside opening 84. The wet chemical etch may comprise a hot phosphoric acid etch which may selectively etch the blocking dielectric 7 (which may comprise aluminum oxide) from the sidewalls 511 and bottom surface 514 of the back side opening 84. As discussed above, the oxidized portions 535 of the control gate electrodes 3 may protect the metal material of the control gate electrodes from damage during this etching step. In addition, when a wet chemical etch such as a hot phosphoric acid etch is utilized, the blocking dielectric 7 may be removed from the exposed surfaces of the back side opening without causing excessive etching of the substrate 100 (e.g., a silicon substrate).

Referring to FIG. 5I, a layer of insulating material 513 may be formed over the sidewalls 511 of the back side opening 84 including over the oxidized portions 535 of the control gate electrodes 3 exposed on the sidewalls 511 of the back side opening. As shown in FIG. 5I, the insulating material 513 may also be formed over the substrate 100 on the bottom surface 514 of the back side opening 84. In embodiments, the layer of insulating material 513 may comprise silicon oxide.

Referring to FIG. 5J, portion of the layer of insulating material 513 located over the bottom surface 514 of the back side opening 84 may be removed by etching (e.g., using a directional etch, such as a reactive ion etch (RIE)) to expose the substrate 100 on the bottom surface 514 of the back side opening 84. In embodiments, the etching may expose a source region 533 that is located in or over the substrate 100. The source region 533 may comprise a doped region of the substrate 100 which may be implanted into the substrate through the back side opening 84.

A source side electrode 102 (i.e., source line) comprising an electrically conductive material may be formed within the back side opening 84, as shown in FIG. 5J. The layer of insulating material 513 may electrically insulate the source side electrode 102 from the plurality of control gates 3 along the sidewall 511 of the back side opening 84. The source side electrode 102 may comprise one or more electrically conductive materials, such as a metal, metal nitride, metal silicide or heavily doped semiconductor material. The source side electrode 102 may be formed in contact with the source region 533 located at the bottom 514 of the back side opening 84. The source side electrode 102 may electrically contact the semiconductor channel 1 from below the device levels of the NAND string 150 via the source region and the horizontal channel portion 512 extending on or within the substrate 100.

As shown in FIG. 5J, the blocking dielectric 7 in this embodiment may include discrete clam shape portions comprising a metal oxide material (e.g., aluminum oxide) that surround the control gate electrodes 3 on the top 525, bottom 527 and first side surfaces 529 of the control gate electrodes 3 (see FIG. 5F). As used herein a "clam" shape is a side cross sectional shape configured similar to an English letter "C". A clam shape has two segments 537, 539 which extend substantially parallel to each other and to the major surface 100a of the substrate 100. The two segments 537, 539 are connected to each other by a third segment 541 which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments 537, 539, 541 and having a fourth side open. The clam shape portions of the blocking dielectric 7 in each device level are separated from each other along at least the sidewall 511 of the back side opening 81 (i.e., the open fourth sides of the clam shape portions of the blocking dielectric 7 are not connected to one another over the sidewall 511 of the back side opening 84). Each of the control gate electrodes 3 is surrounded on three sides by the clam shaped portions of the blocking dielectric 7 and an oxidized portion 535 comprising a metal oxide (e.g., tungsten oxide) material is located over a fourth side 531 of the control gate electrode 3 (i.e., corresponding to the open fourth side of the clam shaped portion of the blocking dielectric 7).

A second embodiment method of making a NAND string 150 is illustrated in FIGS. 6A-6D. In this embodiment, the blocking dielectric 7 is formed using a "front side" approach (i.e., through a front side opening 81 as shown in FIG. 5B), and a portion of the blocking dielectric 7 is electively removed from the bottom surface 508 of the front side opening 81.

FIGS. 6A-6D are partial cross-section views showing the region 520 of the stack 120 indicated by dashed lines in FIG.

5B. Referring to FIG. 6A, following the etching of the stack 120 to form one or more front side openings 81 as described above, an oxide layer 601 may be formed over the exposed surfaces of the second material layers 121 (e.g., silicon nitride layers) on the sidewall 507 of the front side opening 81 and over the exposed surface of the substrate 100 (e.g., silicon substrate) on the bottom surface 508 of the front side opening 81. In the embodiment of FIG. 6A, the front side opening 81 extends partially into the substrate 100 such that the substrate 100 forms a portion of the sidewall 507 of the front side opening 81. The oxide layer 601 may also be formed over the portion of the substrate 100 that forms a portion of the sidewall 507 of the front side opening 81. In embodiments, the oxide layer 601 may be formed using an in-situ steam generation (ISSG) process.

Referring again to FIG. 6A, a blocking dielectric 7 may be formed in the front side opening 81 including over the sidewall 507 and bottom surface 508 of the front side opening 81. As discussed above, the blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the blocking dielectric 7 may include a metal oxide material, such as aluminum oxide and/or hafnium oxide, and may comprise a stack comprising at least one layer of a metal oxide and at least one layer of an additional insulating material. In the embodiment of FIG. 6A, the blocking dielectric 7 comprises a layer of aluminum oxide 603 and a layer of silicon oxide 605 over the layer of aluminum oxide 603.

Referring again to FIG. 6A, a charge storage material 9 may be formed in the front side opening 81 including on the sidewall 507 and bottom surface 508 of the front side opening 81. The charge storage material 9 may be formed over the blocking dielectric 7 (e.g., on the layer of silicon oxide 605 as shown in FIG. 6A). A tunnel dielectric layer 11 may be formed in the front side opening 81 on the sidewall 507 and bottom surface 508 of the front side opening 81. The tunnel dielectric 11 may be formed over the charge storage material 9.

In embodiments, the charge storage material 9 may comprise a continuous dielectric charge trap layer (e.g., a silicon nitride layer) that extends over the sidewall 507 and bottom surface of the front side opening 81. In other embodiments, the charge storage material 9 may comprise a plurality of spaced apart floating gates (e.g., comprising a semiconductor material, such as polysilicon or silicon germanium, or a metal or metal alloy, such as a metal nitride or metal silicide). The tunnel dielectric 11 may comprise a layer of an insulating material (e.g., an oxide layer, such as a silicon oxide or silicon oxynitride layer). In the embodiment shown in FIG. 6A, the charge storage material 9 comprises a silicon nitride charge trap layer and the tunnel dielectric 11 comprises a silicon oxynitride layer formed over the silicon nitride charge trap layer.

Referring again to FIG. 6A, a semiconductor cover layer 607 (e.g., a polysilicon or amorphous silicon layer) may be formed in the front side opening, including over the tunnel dielectric layer 11 on the sidewall 507 and bottom surface 508 of the front side opening 81.

Referring to FIG. 6B, a first etching process (e.g., an anisotropic dry etching process, such as reactive ion etch (RIE) process) may be used to remove portions of the semiconductor cover layer 601, the tunnel dielectric 11, the charge storage material 9 and the silicon oxide layer 605 from over the bottom surface 508 of the front side opening 81. The etching may be stopped at the aluminum oxide layer 603 to expose a portion of the layer 603 extending over the bottom surface 508 of the front side opening 81. Aggressive directional dry etching through layer 603 may result in sputtering of aluminum and/or aluminum oxide onto the semiconductor cover layer 601 extending over the sidewall 507 of the front side opening 81, thus contaminating the cover layer 607 (which may form at least a portion of the semiconductor channel 1 of the vertical NAND string 150) and potentially resulting in shorting issues in the completed NAND strings 150.

Referring again to FIG. 6B, following the etching through the semiconductor cover layer 607, the tunnel dielectric 11, the charge storage material 9 and the silicon oxide layer 605 of the blocking dielectric 7 to expose a portion of the aluminum oxide layer 603 over the bottom surface 508 of the front side opening 81, a protective oxide layer 609 may be formed over at least a portion of the sidewall 507 of the front side opening 81. As shown in FIG. 6B, the protective oxide layer 609 may comprise a self-aligned oxide layer that is formed over at least the exposed surface of the semiconductor cover layer 607 (e.g., a portion of a silicon cover layer 607 may be oxidized, e.g., via surface oxidation, to form a thin silicon oxide surface layer 609). The protective oxide layer 609 may also be formed over the exposed edge surfaces of one or more of layers 11, 9 and 605 at the bottom of the opening 81. If the charge storage material 9 comprises a silicon nitride charge trap layer, then the exposed surface of the layer 9 may be oxidized to form a silicon oxynitride surface layer. The protective oxide layer 609 may protect the layers 609, 11, 9, 605 from being etched during a subsequent etching step to remove portions of the aluminum oxide blocking dielectric layer 603, as described below.

Referring to FIG. 6C, a second etching process may be used to remove the exposed portion of the aluminum oxide layer 603 of the blocking dielectric 7 from the bottom surface 508 of the front side opening 81 to expose the oxide layer 601 (e.g., ISSG oxide layer) over the substrate 100 at the bottom surface 508 of the front side opening 81. The second etching process may be different than the first etching process described above with reference to FIG. 6B. In embodiments, the second etching process may comprise a wet chemical etching process, such as a hot phosphoric acid etching process. The wet chemical etch may selectively etch the aluminum oxide material of layer 603 relative to the materials of layers 607, 11, 9 and 605. In addition, the protective oxide layer 609 (see FIG. 6B) may help protect at least the semiconductor cover layer 607 (and optionally layers 11, 9 and/or 605) from etching damage during the second etching process. The etching may stop at the oxide layer 601 on the bottom surface 508 of the front side opening 81. The oxide layer 601 may protect the substrate 100 from being etched during the second etching process. Thus, in embodiments, the substrate 100 may avoid over etching during the removal of an aluminum oxide Referring again to FIG. 6C, a third etching process may be used to remove the protective oxide layer 609 (see FIG. 6B) from over the sidewall 507 of the front side opening 81. The removal of the protective oxide layer 609 may expose the semiconductor cover layer 607 over at least a portion of the sidewall 507 of the front side opening 81, as shown in FIG. 6C. In addition, the third etching process may remove the oxide layer 601 from the bottom surface 508 of the front side opening 81 and expose the substrate 100 (e.g., silicon substrate) at the bottom surface 508 of the front side opening 81. The third etching process may be different from the first etching process and/or the second etching process. In embodiments, the third etching process may be a wet chemical etching process, such as a dilute hydrofluoric acid (DHF) etching process.

Referring to FIG. 6D, a semiconductor material channel layer 611 (e.g. a polysilicon or amorphous silicon layer) may be formed over the semiconductor cover layer 607 and over the edges of layers 11, 9, 603, 605, 609 and 601 exposed during the first, second and third etching processes. The semiconductor material channel layer 611 may also be formed over the bottom surface 508 of the front side opening and contacting the semiconductor substrate 100. Together layers 607 and 611 may form a vertically oriented semiconductor channel 1 as described above with reference to FIGS. 1A-2B and 3B. An optional insulating fill material (e.g., insulating fill 2 as shown in FIGS. 1A-1B and 5C, not shown in FIG. 6D) may be provided over the channel layer 611 within the front side opening 81.

The fabrication method in this embodiment may continue similar to the method described above with reference to FIGS. 5D-5J. In particular, the stack 120 may be etched to form a back side opening 84 in the stack 120 (see FIG. 5D), at least a portion of the second material layers 121 may be removed through the back side opening 84 to form back side recesses 509 between the first material layers 19 (see FIG. 5E), control gates 3 (and optionally an additional blocking dielectric 7) may be formed in the back side recesses 509 (see FIG. 5F), an insulating layer 513 may be formed over the sidewalls 511 of the back side opening 84 (see FIG. 5I), and a source side electrode 102 (i.e., source line) comprising an electrically conductive material may be formed over the insulating layer 513 within the back side opening 84 and electrically contacting the semiconductor channel 1 from below the device levels (see FIG. 5J).

As shown in FIG. 6D, the blocking dielectric 7 in this embodiment may comprise a metal oxide material (e.g., aluminum oxide), and may include a first portion 613 that extends over the sidewall 507 of the front side opening 81 in a direction that is substantially perpendicular to the major surface 100a of the substrate 100, and a second portion 615 that extends over the bottom surface 508 of the front side opening 81 in a direction that is substantially parallel to the major surface 100a of the substrate 100. In embodiments, the first portion 613 may have a general shape of a hollow tube or cylinder that extends over the device levels and the second portion 615 may have a general shape of a flat plate or disk located at one end of the hollow tubular or cylindrical first portion 613 (i.e., below the device levels) and extending radially-inward from the end of the first portion. The second portion 615 may also include an opening 617 (e.g., a generally cylindrically-shaped opening), extending through the second portion 615, and the semiconductor channel 1 of the NAND string 150 extends through the opening 617.

Figure 7G:
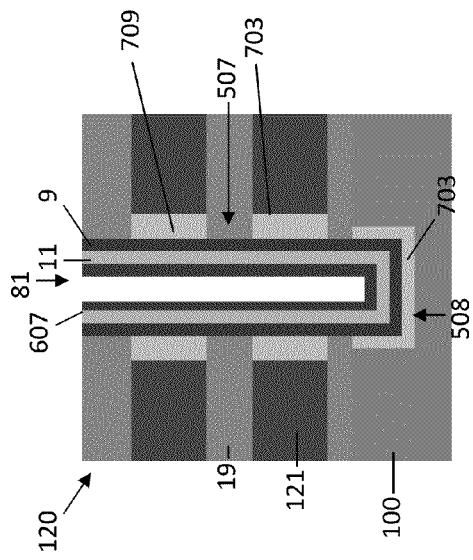

A third embodiment method of making a NAND string 150 is illustrated in FIGS. 7A-7J. In this embodiment, the blocking dielectric 7 is formed through the front side opening 81 as a plurality of discrete segments. FIGS. 7A-7J are partial cross-section views showing the region 522 of the stack 120 indicated by dashed lines in FIG. 5B. Referring to FIG. 7A, following the etching of the stack 120 to form one or more front side openings 81 as described above, a first portion of the second material layers 121 may be removed through the front side opening 81 to form front side recesses 701 between the first material layers 19. In embodiments, the second material layers 121 may comprise silicon nitride that is selectively etched relative to the material (e.g., silicon oxide) of the first material layers 19 to form the front side recesses 701. The layers 121 may be etched using a wet chemical etching process (e.g., using a hot phosphoric acid etch).

Referring to FIG. 7B, an oxide layer 703 may be formed over the exposed surfaces of the second material layers 121 (e.g., silicon nitride layers) within the front side recesses 701 and over the exposed surface of the substrate 100 (e.g., silicon substrate) on the bottom surface 508 of the front side opening 81. In the embodiment of FIG. 7A, the front side opening 81 extends partially into the substrate 100 such that the substrate 100 forms a portion of the sidewall 507 of the front side opening 81. The oxide layer 703 may also be formed over the portion of the substrate 100 that forms a portion of the sidewall 507 of the front side opening 81. In embodiments, the oxide layer 703 may be formed using an in-situ steam generation (ISSG) process.

Referring to FIG. 7C, a blocking dielectric 7 may be formed over the sidewall 507 and the bottom surface 508 of the front side recess 81, including within the front side recesses 701. The blocking dielectric 7 may be formed over the oxide layer 703 within each of the front side recesses 701 and over the bottom surface 508 of the front side recess 81. The blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the blocking dielectric 7 may include a metal oxide material, such as aluminum oxide and/or hafnium oxide, and may comprise a stack comprising at least one layer of a metal oxide and at least one layer of an additional insulating material. For example, the blocking dielectric 7 may comprise a layer of aluminum oxide and a layer of silicon oxide.

Referring to FIG. 7D, an oxide cover layer 705 may be formed over the blocking dielectric 7 on the sidewall 507 and bottom surface 508 of the front side opening 81 and within the front side recesses 701. The oxide cover layer 705 may comprise silicon oxide that may be deposited using a suitable method (e.g., CVD).

Referring to FIG. 7E, portions of the oxide cover layer 705 may be removed from the sidewall 507 and the bottom surface 508 of the front side opening 81 via an etch back process to provide discrete segments 707 of the oxide cover layer 705 within the front side recesses 701. The etch back process may expose first portions of the blocking dielectric 7 on the sidewall 507 and bottom surface 508 of the front side opening 81, while second portions of the blocking dielectric 7 within the front side recesses 701 may be covered by the segments 707 of the oxide cover layer 705, as shown in FIG. 7E.

Referring to FIG. 7F, the exposed first portions of the blocking dielectric 7 may be removed by etching the blocking dielectric 7 from the sidewall 507 and the bottom surface 508 of the front side opening 81 to provide discrete segments 709 of the blocking dielectric 7 within each of the front side recesses 701. The blocking dielectric 7 may be etched using a wet chemical etch process, such as a hot phosphoric acid etching process. The segments 707 of the oxide cover layer 705 may protect the portions of the blocking dielectric 7 within the front side recesses 701 from being etched. In addition, the oxide layer 703 (e.g., ISSG oxide) over the semiconductor substrate 100 may protect the substrate 100 from being etched at the bottom of the front side opening 81. An additional etch back step may then be performed to remove the segments 707 of the oxide cover layer 705, as shown in FIG. 7F.

Referring to FIG. 7G, a charge storage material 9 may be formed in the front side opening 81 including on the sidewall 507 and bottom surface 508 of the front side opening 81. The charge storage material 9 may be formed over the discrete segments 709 of the blocking dielectric 7. A tunnel dielectric layer 11 may be formed in the front side opening 81 on the sidewall 507 and bottom surface 508 of the front side opening 81. The tunnel dielectric 11 may be formed over the charge storage material 9.

In embodiments, the charge storage material 9 may comprise a continuous dielectric charge trap layer (e.g., a silicon nitride layer) that extends over the sidewall 507 and bottom surface of the front side opening 81. In other embodiments, the charge storage material 9 may comprise a plurality of spaced apart floating gates (e.g., comprising a semiconductor material, such as polysilicon or silicon germanium, or a metal or metal alloy, such as a metal nitride or metal silicide). The tunnel dielectric 11 may comprise a layer of an insulating material (e.g., an oxide layer, such as a silicon oxide or silicon oxynitride layer).

Referring again to FIG. 7G, a semiconductor cover layer 607 (e.g., a polysilicon or amorphous silicon layer) may be formed in the front side opening, including over the tunnel dielectric layer 11 on the sidewall 507 and bottom surface 508 of the front side opening 81.

Figure 7I:
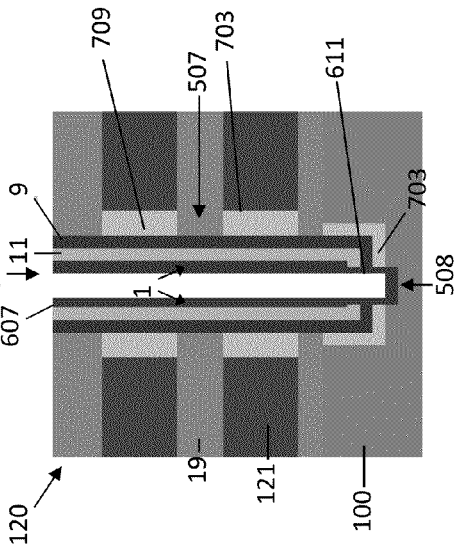
Figure 7H:
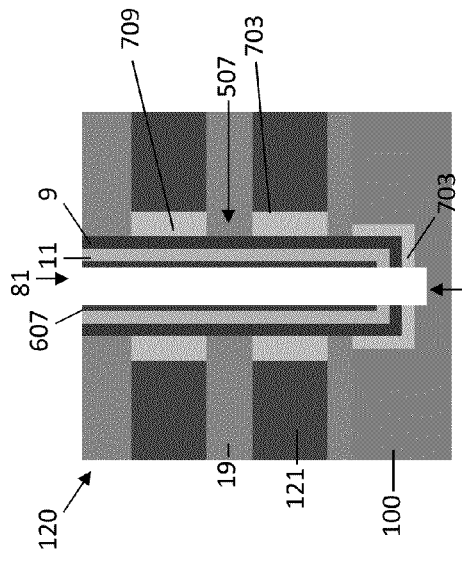

Referring to FIG. 7H, an etching process (e.g., an anisotropic dry etching process, such as reactive ion etch (RIE) process) may be used to remove portions of the semiconductor cover layer 607, the tunnel dielectric 11, the charge storage material 9 and the oxide layer 703 from over the bottom surface 508 of the front side opening 81. The etching process may expose the semiconductor substrate 100 on the bottom surface 508 of the front side opening 81. During the etching, the semiconductor cover layer 607 may protect the tunnel dielectric 11, charge storage material 9 and blocking dielectric 7 against etching damage.

Referring to FIG. 7I, a semiconductor material channel layer 611 (e.g. a polysilicon or amorphous silicon layer) may be formed over the semiconductor cover layer 607 and over the edges of layers 11, 9 and 703 exposed during the etching step of FIG. 7H. The semiconductor material channel layer 611 may also be formed over the bottom surface 508 of the front side opening and contacting the semiconductor substrate 100. Together layers 607 and 611 may form a vertically oriented semiconductor channel 1 as described above with reference to FIGS. 1A-2B and 3B. An optional insulating fill material 2 (e.g., silicon oxide fill material) may be provided over the channel layer 611 within the front side opening 81 as shown in FIG. 7J.

The fabrication method in this embodiment may continue similar to the method described above with reference to FIGS. 5D-5J. In particular, the stack 120 may be etched to form a back side opening 84 in the stack 120 (see FIG. 5D), at least a portion of the second material layers 121 may be removed through the back side opening 84 to form back side recesses 509 between the first material layers 19 (see FIG. 5E), control gates 3 (and optionally an additional blocking dielectric 7) may be formed in the back side recesses 509 (see FIG. 5F), an insulating layer 513 may be formed over the sidewalls 511 of the back side opening 84 (see FIG. 5I), and a source side electrode 102 (i.e., source line) comprising an electrically conductive material may be formed over the insulating layer 513 within the back side opening 84 and electrically contacting the semiconductor channel 1 from below the device levels (see FIG. 5J).

Figure 7J:
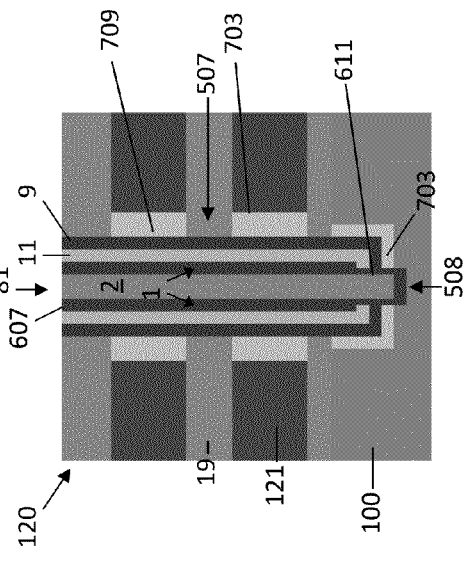

As shown in FIG. 7J, the blocking dielectric 7 in this embodiment may comprise a metal oxide material (e.g., aluminum oxide), and may include a plurality of discrete segments 709 of blocking dielectric 7 within each of the device levels. The segments 709 may be formed in recessed portions 701 between the first material layers 19 of the stack such that the first material layers 19 are located between the segments 709 in the respective device levels.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a monolithic, three dimensional NAND string, comprising:
    forming a stack of alternating layers of a first material and a second material different than the first material over a substrate;
    etching the stack to form a front side opening in the stack;
    forming at least one memory film over a sidewall of the front side opening;
    forming a semiconductor channel over the at least one memory film in the front side opening;
    etching the stack to form a back side opening in the stack, the backside opening including a pair of oppositely disposed sidewalls and a bottom surface;
    removing by etching at least a portion of the second material layers through the back side opening to form back side recesses between the first material layers;
    forming a blocking dielectric over the sidewalls and bottom surface of the backside opening and within the back side recesses;
    forming control gates comprising a metal material over the blocking dielectric in the back side recesses through the back side opening, wherein each control gate comprises a first side surface facing the semiconductor channel in the front side opening and a second side surface opposite the first side surface that forms a portion of a sidewall of the back side opening;
    oxidizing a portion of the metal material of the control gates adjacent to the second side surfaces of the control gates; and
    etching the back side opening using a wet chemical etch to remove the blocking dielectric from the sidewalls and the bottom surface of the backside opening.

2. The method of claim 1, further comprising:
    forming a layer of insulating material over the sidewalls of the backside opening; and
    forming an electrically conductive source line within the backside opening such that the insulating material over a sidewall of the backside opening is located between the source line and the plurality of control gates.

3. The method of claim 2, wherein the layer of insulating material is formed over the sidewalls and bottom surface of the backside opening, the method further comprising:
    removing by etching a portion of the insulating material over the bottom surface of the backside opening to expose a source region in or over the substrate, wherein the electrically conductive source line is formed in electrical contact with the source region.

4. The method of claim 1, wherein oxidizing a portion of the metal material of the control gates comprises performing a plasma silane oxidation of the metal material through the back side opening.

5. The method of claim 4, wherein etching the back side opening using a wet chemical etch comprises etching using a hot phosphoric acid etch.

6. The method of claim 5, wherein the blocking dielectric comprises a metal oxide material.

7. The method of claim 6, wherein the blocking dielectric comprises aluminum oxide.

8. The method of claim 1, wherein the at least one memory film comprises a charge storage layer and a tunnel dielectric layer formed over the charge storage layer such that the tunnel dielectric layer is located between the charge storage layer and the semiconductor channel in the front side opening.

9. The method of claim 8, wherein the blocking dielectric and control gates are formed within the back side recesses such that the blocking dielectric extends over the first side surface of each of the control gates and is located between each of the control gates and the charge storage layer.

10. The method of claim 1, wherein forming the control gates comprises forming a liner layer of a metal nitride material over the blocking dielectric in each of the back side recesses and forming the metal material over the liner layer.

11. The method of claim 10, wherein the liner layer comprises titanium nitride, the metal material comprises tungsten and oxidizing a portion of the metal material comprises forming tungsten oxide regions adjacent to the second side surfaces of the control gates.

12. The method of claim 1, further comprising forming one of a source or drain electrode which contacts one of a source or drain region which contacts the semiconductor channel from above, and another of a source or drain electrode which contacts another one of the source or drain region which contacts the semiconductor channel below the stack to form the monolithic three dimensional NAND string in which at least one memory cell in the first device level is located over another memory cell in the second device level and the substrate comprises a silicon substrate which contains an integrated circuit comprising a driver circuit for the monolithic three dimensional NAND string located thereon.

13. The method of claim 1, wherein:
the semiconductor channel has a U-shaped side cross section;
two wing portions of the U-shaped semiconductor channel extend substantially perpendicular to a major surface of the substrate are connected by a connecting portion which extends substantially parallel to a major surface of the substrate;
one of a source or drain electrode contacts the first wing portion of the semiconductor channel from above; and
another one of a source or drain electrode contacts the second wing portion of the semiconductor channel from above.

14. A method of making a monolithic, three dimensional NAND string, comprising:
forming a stack of alternating layers of a first material and a second material different than the first material over a substrate;
etching the stack to form a front side opening in the stack;
forming a blocking dielectric on a sidewall and a bottom surface of the front side opening;
forming a charge storage layer over the blocking dielectric on the sidewall and bottom surface of the front side opening;
forming a tunnel dielectric layer over the charge storage layer on the sidewall and bottom surface of the front side opening;
forming a semiconductor cover layer over the tunnel dielectric layer on the sidewall and bottom surface of the front side opening;
removing by a first etching process portions of the semiconductor cover layer, the tunnel dielectric layer and the charge storage layer over the bottom surface of the front side opening to expose the blocking dielectric over the bottom surface of the front side opening;
forming a protective oxide layer over the semiconductor cover layer on the sidewall of the front side opening;
removing by a second etching process the blocking dielectric over the bottom surface of the front side opening, wherein the protective oxide layer protects the semiconductor cover layer on the sidewall of the front side opening from etching damage during the second etching process, and the second etching process is different from the first etching process;
removing by a third etching process the protective oxide layer to expose the semiconductor cover layer on the sidewall of the front side opening, wherein the third etching process is different from the second etching process; and
forming a semiconductor channel over the semiconductor cover layer over the sidewall of the front side opening and contacting the bottom surface of the front side opening.

15. The method of claim 14, wherein the first, second and third etching processes are each different from one another.

16. The method of claim 15, wherein the first etching process comprises a reactive ion etching process and the second and third etching processes each comprise wet chemical etch processes.

17. The method of claim 14, wherein the second etching process comprises a hot phosphoric acid etching process.

18. The method of claim 17, wherein the third etching process comprises a dilute hydrofluoric acid etching process.

19. The method of claim 14, wherein the blocking dielectric comprises a metal oxide.

20. The method of claim 19, wherein the blocking dielectric comprises aluminum oxide.

21. The method of claim 20, wherein the blocking dielectric comprises a layer of aluminum oxide and a cover layer of silicon oxide formed over the layer of aluminum oxide, wherein a portion of the silicon oxide cover layer located over the bottom surface of the front side opening is removed during the first etching process to expose the aluminum oxide layer of the blocking dielectric.

22. The method of claim 14, wherein the stack comprises alternating layers of silicon oxide and silicon nitride over a silicon substrate and the sidewall of the front side opening is defined at least partially by the alternating layers of silicon oxide and silicon nitride and the bottom surface of the front side opening is defined by the silicon substrate, the method further comprising:
forming an oxide layer over the silicon nitride layers on the sidewall of the front side opening and over the silicon substrate on the bottom surface of the front side opening, wherein the blocking dielectric is formed over the oxide layer.

23. The method of claim 22, wherein the oxide layer is formed over the silicon nitride layers on the sidewall of the front side opening and over the silicon substrate on the bottom surface of the front side opening using an in situ steam generation process.

24. The method of claim 22, wherein the oxide layer on the bottom surface of the front side opening is removed during the third etching process to expose the silicon substrate on the bottom surface of the front side opening, and the semiconductor channel is formed in contact with the exposed silicon substrate on the bottom surface of the front side opening.

25. The method of claim 14, wherein the protective oxide layer is formed by surface oxidation of the semiconductor cover layer.

26. The method of claim 14, wherein the semiconductor cover layer and the semiconductor channel comprise amorphous silicon.

27. The method of claim 14, further comprising:
etching the stack to form a back side opening in the stack;
removing by etching at least a portion of the second material layers through the back side opening to form back side recesses between the first material layers; and
forming control gates in the back side recesses through the back side opening, wherein the blocking dielectric on the sidewall of the front side memory opening is located between each of the control gates and the semiconductor channel in the front side opening.

28. The method of claim 14, further comprising forming one of a source or drain electrode which contacts one of a source or drain region which contacts the semiconductor channel from above, and another of a source or drain electrode which contacts another one of the source or drain region which contacts the semiconductor channel below the stack to form the monolithic three dimensional NAND string in which at least one memory cell in the first device level is located over another memory cell in the second device level and the substrate comprises a silicon substrate which contains an integrated circuit comprising a driver circuit for the monolithic three dimensional NAND string located thereon.

29. A method of making a monolithic three dimensional NAND string, comprising:
forming a stack of alternating layers of a first material and a second material different than the first material over a substrate;
etching the stack to form a front side opening in the stack comprising a sidewall and a bottom surface;
removing a first portion of the second material layers through the front side opening to form front side recesses between the first material layers on the sidewall of the front side opening;
forming a blocking dielectric over the sidewall and bottom surface of the front side opening and within the front side recesses;
forming an oxide cover layer over the blocking dielectric on the sidewall and bottom surface of the front side opening and within the front side recesses;
removing by etching a first portion of the oxide cover layer from the sidewall and the bottom surface of the front side opening to provide discrete segments of a second portion of the oxide cover layer within the respective front side recesses;
removing by etching a first portion of the blocking dielectric from the sidewall and the bottom surface of the front side opening to provide discrete segments of a second portion of the blocking dielectric within the respective front side recesses, wherein the discrete segments of the oxide cover layer prevent the blocking dielectric within the front side recesses from being etched;
removing by etching the discrete segments of the second portion of the oxide cover layer from the front side recesses;
forming a charge storage layer on the sidewall and bottom surface of the front side opening and over the discrete segments of the second portion of the blocking dielectric within the front side recesses;
forming a tunnel dielectric layer over the charge storage layer on the sidewall and bottom surface of the front side opening;
forming a semiconductor cover layer over the tunnel dielectric layer on the sidewall and bottom surface of the front side opening;
removing by etching portions of the semiconductor cover layer, the tunnel dielectric layer and the charge storage layer over the bottom surface of the front side opening; and
forming a semiconductor channel over the semiconductor cover layer over the sidewall of the front side opening and contacting the bottom surface of the front side opening.

30. The method of claim 29, wherein the stack comprises alternating layers of silicon oxide and silicon nitride over a silicon substrate and the sidewall of the front side opening is defined at least partially by the alternating layers of silicon oxide and silicon nitride and the bottom surface of the front side opening is defined by the silicon substrate, the method further comprising:
forming an oxide layer over the silicon nitride layers in the front side recesses on the sidewall of the front side opening and over the silicon substrate on the bottom surface of the front side opening, wherein the blocking dielectric is formed over the oxide layer in the front side recesses and on the bottom surface of the front side opening.

31. The method of claim 30, wherein the oxide layer is formed over the silicon nitride layers in the front side recesses on the sidewall of the front side opening and over the silicon substrate on the bottom surface of the front side opening using an in situ steam generation process.

32. The method of claim 31, wherein the etching to remove the first portion of the blocking dielectric from the bottom surface of the front side opening stops at the oxide layer over the bottom surface of the front side opening.

33. The method of claim 32, wherein a portion of the oxide layer over the bottom surface of the front side opening is etched with the semiconductor cover layer, the tunnel dielectric layer and the charge storage layer to expose the substrate at the bottom of the front side opening.

34. The method of claim 29, wherein the blocking dielectric comprises a metal oxide.

35. The method of claim 34, wherein the blocking dielectric comprises aluminum oxide.

36. The method of claim 29, wherein the first portions of the blocking dielectric are removed by a hot phosphoric acid etching process.

37. The method of claim 36, wherein the first and second portions of the oxide cover layer are removed using an etching process that is different from the hot phosphoric acid etching process.

38. The method of claim 29, further comprising:
etching the stack to form a back side opening in the stack;
removing by etching at least a portion of the second material layers through the back side opening to form back side recesses between the first material layers;
forming control gates in the back side recesses through the back side opening, wherein the discrete segments of the blocking dielectric are located between each of the control gates and the semiconductor channel in the front side opening.

39. The method of claim 29, further comprising forming one of a source or drain electrode which contacts one of a source or drain region which contacts the semiconductor channel from above, and another of a source or drain electrode which contacts another one of the source or drain region which contacts the semiconductor channel below the stack to form the monolithic three dimensional NAND string in which at least one memory cell in the first device level is located over another memory cell in the second device level and the substrate comprises a silicon substrate which contains an integrated circuit comprising a driver circuit for the monolithic three dimensional NAND string located thereon.

* * * * *